(12) United States Patent
Proslier et al.

(10) Patent No.: US 8,518,179 B1
(45) Date of Patent: Aug. 27, 2013

(54) CONTROLLING THE EMISSIVE PROPERTIES OF MATERIALS-IMPROVED LASERS AND UPCONVERSION MATERIALS

(75) Inventors: Thomas Proslier, Woodbridge, IL (US); Nicholas G. Becker, Chicago, IL (US); Michael J. Pellin, Naperville, IL (US); Jeffrey Klug, Westmont, IL (US); Jeffrey W. Elam, Elmhurst, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

(21) Appl. No.: 13/385,661

(22) Filed: Feb. 29, 2012

(51) Int. Cl.
*C30B 23/00* (2006.01)
*C30B 25/00* (2006.01)
*C30B 28/12* (2006.01)
*C30B 28/14* (2006.01)

(52) U.S. Cl.
USPC .............................. 117/84; 427/250; 427/537

(58) Field of Classification Search
USPC ................. 117/84, 88, 89, 92, 104; 427/250, 427/535, 537, 539
See application file for complete search history.

(56) References Cited

U.S. PATENT DOCUMENTS

| | | | | |
|---|---|---|---|---|
| 7,544,398 | B1* | 6/2009 | Chang et al. | 427/537 |
| 2004/0206387 | A1* | 10/2004 | Funakubo | 136/236.1 |
| 2005/0208257 | A1* | 9/2005 | Cheong et al. | 428/64.4 |
| 2008/0119098 | A1* | 5/2008 | Palley et al. | 442/64 |

OTHER PUBLICATIONS

Groner et al., "Low-Temperature Al2O3 Atomic Layer Deposition". Chem. Mater. 2004, 16, 639-645.*

* cited by examiner

*Primary Examiner* — Leonard Chang
(74) *Attorney, Agent, or Firm* — Foley & Lardner LLP

(57) ABSTRACT

Systems and methods for producing crystalline materials by atomic layer deposition, allowing for high control of localized doping. Such materials may be fibers or films suitable for use in optoelectronics and lasers.

12 Claims, 7 Drawing Sheets

CONTROLLING THE EMISSIVE PROPERTIES OF MATERIALS-IMPROVED LASERS AND UPCONVERSION MATERIALS

The United States Government claims certain rights in this invention pursuant to Contract No. DE-AC02-06CH11357 between the United States Government and U Chicago Argonne, LLC representing Argonne National Laboratory. The United States Government also claims certain rights in this invention pursuant to research sponsored by the Army Research Lab, ANL Cost Code 8R26900.

RELATED APPLICATIONS

This application is related to U.S. patent application Ser. No. 13/370,602, the entirety of which is incorporated herein by reference.

FIELD OF THE INVENTION

The present invention is directed to a method and system for production of crystalline materials through the use Atomic Layer Deposition (ALD). More particularly, the method and system concern production of crystalline materials with locally controlled doping and high doping levels through ALD. In particular, bulk-like lifetime values (~6 ms) obtained with Er doped Yttria fiber made by ALD.

BACKGROUND OF THE INVENTION

The intentional introduction of impurities into a material is fundamental to controlling and tuning the properties of bulk or nanostructured matrices (whether they be insulators, semiconductors, metals, semi-metals, or superconductors). Common doping techniques include, but are not limited to, ion implantation, electro-chemistry, chemical vapor deposition (CVD), physical vapor deposition (PVD), molecular beam epitaxy, sol-gel process, zone refinement crystal growth. These methods rely on a statistical distribution of dopant and, therefore, often present inhomogeneous local concentrations, chemical environments, and properties that in turn hinder the fundamental understanding of the underlying microscopic mechanism and limit the applications range and performances of materials produced through these processes. These methods provide no local control.

SUMMARY OF THE INVENTION

In the present invention, control, down to the atomic level, of the three dimensional dopant distributions in a given bulk material by using Atomic layer deposition (ALD) is described. The main advantage of this technique is that it relies on the self-assembly of the dopant induced by the hindrance effect, does not require expensive nano-patterning in order to separate ions, and can be scaled to arbitrary large surfaces and to a variety of industries. Furthermore, the use of dual-pulsing of organometalic precursors allows further separation.

Possible applications for materials produced by the present invention include, but are not limited to, materials suitable for use in lasers (as laser fibers or films), materials suitable for use in up or down conversion, materials suitable for use in spintronics, and materials suitable for use in thermoelectrics.

BRIEF DESCRIPTION OF THE DRAWING

The patent or application file contains at least one drawing executed in color. Copies of this patent or patent application publication with color drawing(s) will be provided by the Office upon request and payment of necessary fee.

Figure 1:
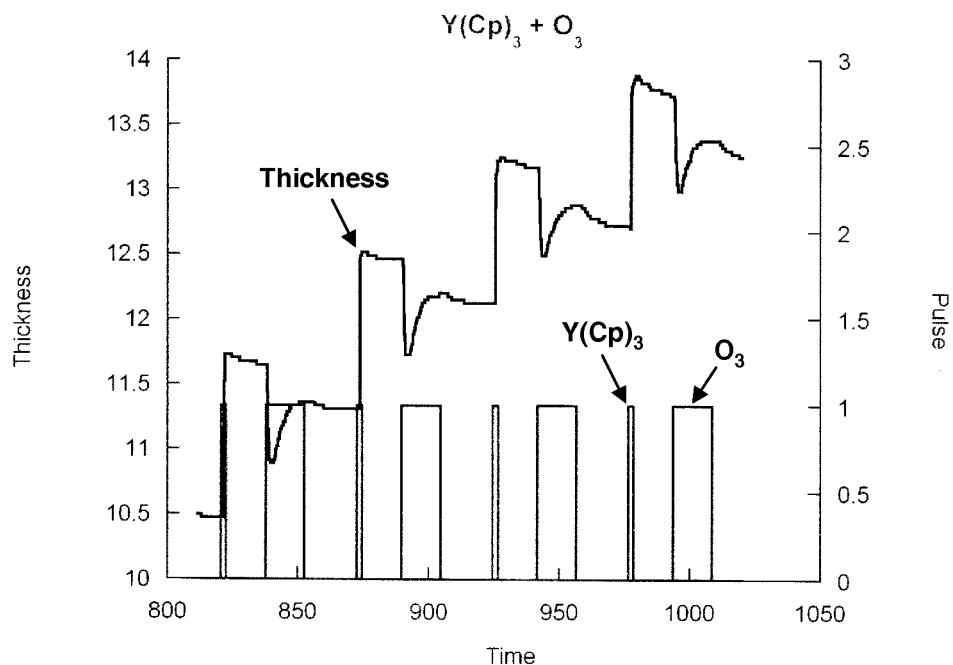
FIG. 1 illustrates Quartz Crystal Microbalance (QCM) mass signals during alternating ALD pulses of tris-cyclopentadienyl yttrium (III) $(Y(Cp)_3)$ and $O_3$.

The patent or application file contains at least one drawing executed in color. Copies of this patent or patent application publication with color drawing(s) will be provided by the Office upon request and payment of necessary fee.

DETAILED DESCRIPTION

The present invention introduced the application of atomic patterning to optical fibers and other crystalline materials. Through the present invention, one can organize doping and develop crystalline materials with localized doping concentrations. The present invention also allows for use of arbitrarily large Atomic Layer Deposition (ALD) precursors molecules, which is an unexpected result In some embodiment, the present invention provides a method for producing a crystalline material of desired composition and thickness through atomic layer deposition. In some embodiments, said method may comprise: introducing a first precursor into a growth chamber; purging the growth chamber these two steps constitute a cycle, the first cycle is refereed as the A cycle, introducing a reducing or oxidizing agent into the growth chamber; purging the growth chamber (refereed as cycle B); This A and B cycles constitute the matrix material into which the dopant will be introduced. The dopant is synthesized by introducing a second precursor into the growth chamber, purging the growth chamber (refereed as the cycle C), introducing a reducing or oxidizing agent and purging the chamber (refereed as the cycle D). In some embodiments the second precursor may comprise a precursor which acts as a dopant. In some embodiments the first precursor is an Yttrium precursor. In some embodiments, the second precursor is an Erbium precursor. In some embodiments, the reducing or oxidizing agent, also called co-reactant, can be an oxygen $(O_2)$, water $(H_2O)$, ozone $(O_3)$, oxygen plasma or any combination of these mentioned sources.

In some embodiments, an Yttrium precursor may be selected from the group consisting of: tricyclopentadienyl yttrium(III) (Y(Cp)$_3$) or tris-methylcyclopentadienyl yttrium (III) (Y(MeCp)$_3$). In some embodiments an Erbium precursor may be selected from the group consisting of: tris-methylcyclopentadienyl erbium(III) (Er(MeCp)$_3$), erbium boranamide (Er(BA)$_3$), or Er(TMHD)$_3$. In some embodiments, the crystalline material produced by the present invention may be Erbium-Doped Yttrium Oxide (Er$^{+3}$:Y$_2$O$_3$). In some embodiments the crystalline material produced by the present invention may be a film. In some embodiments the crystalline material produced by the present invention may be a fiber.

In some embodiments, use of the present invention in producing laser fibers allows high doping levels without letting the ions get so close as to quench the excitation. Doping through the use of ALD allows control and spacing of the ions, to allow for larger ions, and doping levels of up to 3% as opposed to the customary 0.5%.

In particular, the present invention can be used to produce materials for Erbium (Er) doped fiber lasers with significantly increased gains, much higher thermal conductivity than glass and better spectroscopy than that of rare-earth ions in glass (in terms of absorptivity and emission cross-sections). Atomic Layer Deposition can be used to create crystalline Er doped Yttria films that efficiently use Erbium (each Erbium may be in its optimum valence state) and for the first time show radiative lifetimes suitable for laser use (i.e. ~6 millisecond range). Moreover, lifetime value above 4 ms is achieved for concentrations 6 times higher than the standard 0.5% doping limit. To achieve such high lifetime the films need to be annealed at or above temperature of 600 C. The optimal post-annealing temperature depends on the dopant level, films thickness, precursor molecule used for the dopant and the presence of a seed layer of pure Yttria grown by atomic layer deposition prior to the crystalline doped film.

Bulk like lifetime (>6 ms) has been achieved in Er doped Y2O3 films with a thickness of 100 nm grown on 10, 25, 50 or 75 nm thick pure Yttria films that acts as a seed layer for Yttria crystallite growth. For such thin films, the improvement of the lifetime didn't saturate for the post-annealing temperature up to 750 C. For Er doped Y2O3 films grown without seeding layer, the annealing temperature is found to be around 700 C for an optimal lifetime, before decreasing upon annealing at higher temperature. The origin of such different post annealing behavior between the Er doped Yttria films grown on a seed layer or not lies in the grain size of the matrix, here Yttria, when the first dopant cycle is introduced: for films grown without seed layers the Yttria crystallites are smaller than 1 nm and therefore highly defected when the first dopant cycle is introduced. Upon annealing at too high temperature these dopants that do not have a clear crystallographic cage around them will diffuse and gather, inducing a decrease of the emission lifetime. On the contrary, it is found that introducing dopant on at least 10 nm thick seed layer of Yttria do not induce a decrease of the lifetime upon annealing at temperature up to 750 C.

In one embodiment of the present invention, Atomic Layer Deposition may be used as a unique synthesis method for the growth of crystalline, highly doped, erbium-doped Yttrium oxide fibers. Such films may have narrow crystalline emission lines, single exponential decay lines, and with lifetimes greater than 6 milliseconds despite doping levels of around 3%. Such materials can be formed into low loss fibers using standard semiconductor patterning techniques to greatly shorten fiber lengths to achieve high power with a consequent reduction in many non-linear losses associated with fiber matrix materials, such as from Brillouin scattering.

The rationale for using crystalline core Er fiber laser is based on the following: 1) Er cross-sections in glass fibers are low, so absorption is low; 2) significant increases in Er doping level is not an option—due to the well-known Er up-conversion and 3) the consequent fiber lengths requires (of about tens of meters) produce unacceptable stimulated Brillouin scattering (SBS) and other non-linear losses. With utilization of crystalline (single-crystalline or polycrystalline) core, absorption cross-section will increase by at least an order of magnitude. Moreover, using ALD as a deposition method, Er lifetime of value greater than 6 ms at 1.5 µm has been controlled for the first time with up to 3% Er doping levels from the conventional 0.5% limit of current materials utilizing ALD's non-random doping. Combining these two advances into new fiber materials may reduce fiber lengths by almost a factor of 50.

Producing Erbium-Doped Yttrium Oxide Via ALD

In one embodiment of the present invention, Erbium-Doped Yttrium Oxide is produced through the use of ALD. Erbium doped Yttria can have applications in optoelectronics and lasers. In lasers, Erbium doped Yttria can provide eye-safe down conversion and higher concentrations of water absorption. Yttrium oxide provides for high solubility of Erbium and grows poly-crystalline via ALD. Yttrium oxide features a wide band gap of about 5.6 eV and alleviates thermal quenching. Yttrium oxide also features a relatively high index of refraction.

In some embodiments, Yttrium precursors for use in ALD may include Y(Cp)$_3$ or Y(MeCp)$_3$. In some embodiments, Erbium precursors for use in ALD may include Er(MeCp)$_3$, Er(BA)$_3$, or Er(TMHD)$_3$. In some embodiments, a co-reactant or oxygen source for use in ALD may include H$_2$O, H$_2$O$_2$, O$_3$, an oxygen plasma, or mixtures of these oxygen sources. For example, H$_2$O, H$_2$O$_2$, or O$_3$ may be used with Y(Cp)$_3$ or Er(MeCp)$_3$ precursors; H$_2$O, H$_2$O$_2$ may be used with Y(MeCp)$_3$ precursors; H$_2$O$_2$ may be used with Er(BA)$_3$ precursors; or O$_3$ may be used with Er(TMHD)$_3$ precursors.

Figure 2:
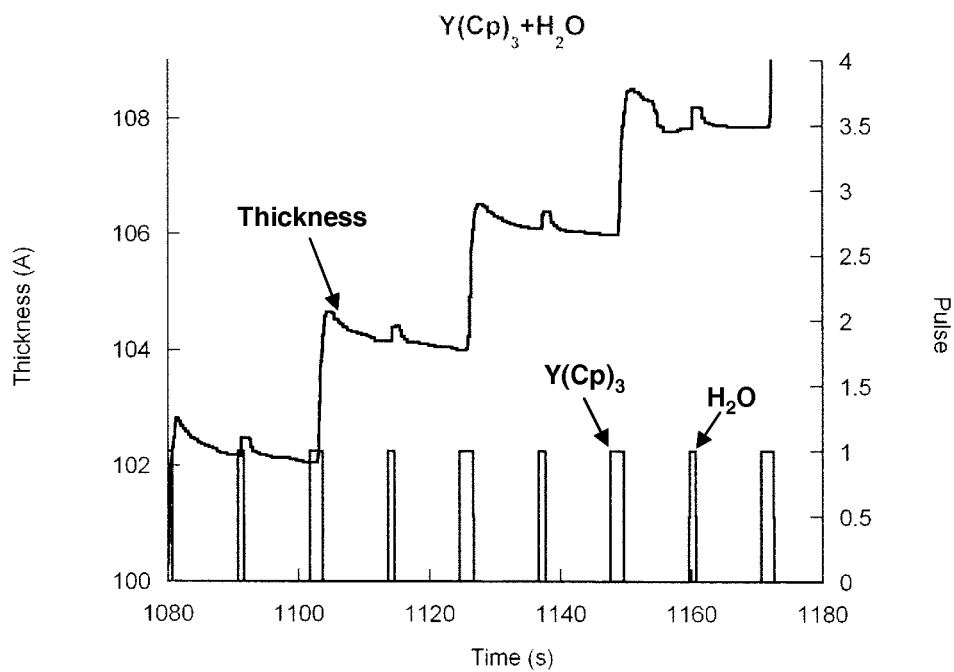
FIG. 2 illustrates QCM mass signals during alternating ALD pulses of $Y(Cp)_3$ and $H_2O$.
Figure 3:
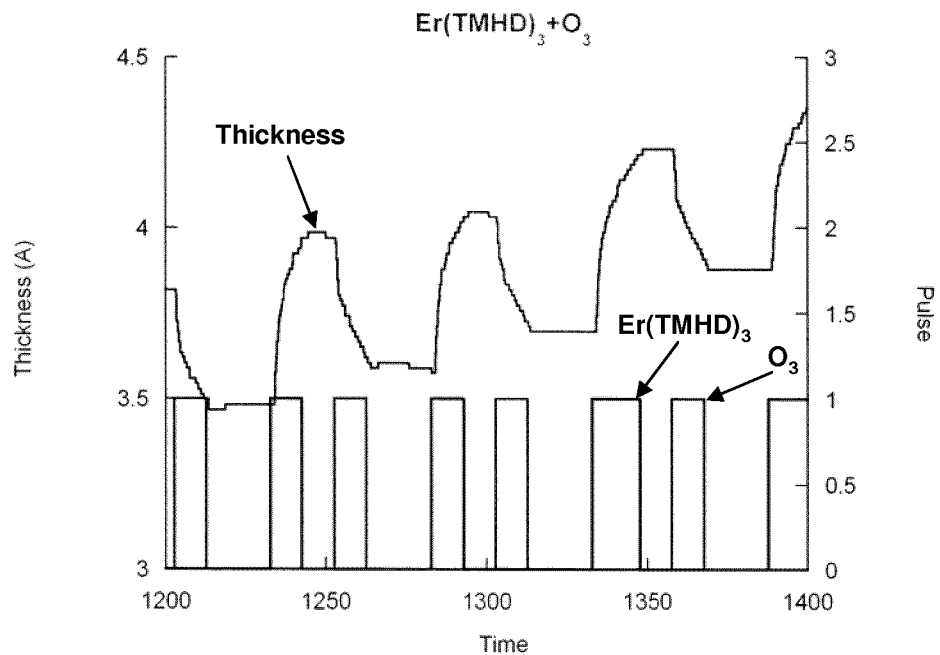
FIG. 3 illustrates QCM mass signals during alternating ALD pulses of erbium(III) tetramethylheptanedionate $(Er(TMHD)_3)$ and $O_3$.
Figure 4:
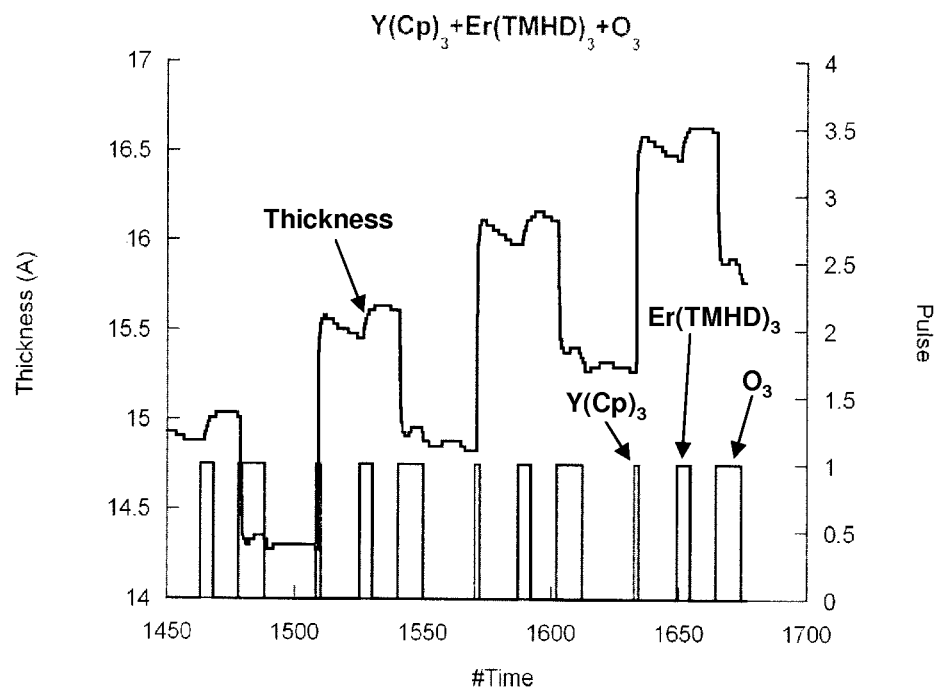
FIG. 4 illustrates QCM mass signals during alternating ALD pulses of $Er(TMHD)_3$, $Y(Cp)_3$ and $O_3$.

In some embodiments, Erbium-doped Yttrium Oxide (Er$^{+3}$:Y$_2$O$_3$) may be produced through the use of Y(Cp)$_3$ and Er(TMHD)$_3$ precursors and O$_3$ as an oxygen source. In such an embodiments, a pulse of Y(Cp)$_3$ may be followed by a purge, then a pulse of Er(TMHD)$_3$, followed by a purge, then a pulse of O$_3$. The QCM mass signals for such an ALD process is illustrated in FIG. 4. Additionally, the QCM mass signals for ALD growth of Y(Cp)$_3$ and Er(TMHD)$_3$ with varying oxygen sources is illustrated in FIGS. 1-3.

The Erbium-doped Yttrium Oxide produced by the invention may have poly-crystalline physical properties. In some embodiments, the grain size of the Erbium-doped Yttrium Oxide may increase with the overall thickness of the material.

Materials for Use in Lasers fiber grown by Atomic layer deposition require a substrate such as sapphire, seed Yttria crystals or any substrate that have high thermal conductivity. The laser fiber utilizing ALD has to be crystalline, with a thermal conductivity higher than amorphous fibers. The ALD fiber can be grown on high aspect ratio structures. Materials produced by the present invention may be used in lasers, and laser fibers or films. In prior art materials for use in lasers, the dopant (for example, erbium) concentration is determined by diffusion processes in both preform and drawing steps of fiber fabrication. In some commercial samples the dopant may diffuse outside the laser cavity and does not contribute to the lasing process, but does remain as a source of inefficiency and waste heat. As such fiber performance is limited to low dopant concentration (~0.5%). Through use of ALD by the present invention, the quenching concentration can be increased by up to 3% while maintaining the integrity of single dopant emission properties (for example, lifetimes above 4 ms). This discovery will not only increase (by about six-fold) the power of a laser fiber but also reduce its size for a given power requirement as compared to conventional fibers.

Materials for Use in Up or Down Conversion

Materials produced by the present invention may be used as materials for up-conversion or down-conversion. Up-conversion (UC) refers to the emission of one high energy photon upon the absorption of two or more lower energy photons, and down-conversion (DC) refers to the analogous process of "cutting" one high energy photon into multiple photons with lower energy. UC and DC may be referred to as forms of photon conversion. In photovoltaic applications, UV-visible to near-infrared (NIR) DC and IR to NIR UC are both of considerable interest as a means to increase solar cell efficiency by reducing the so-called "spectral mismatch" which refers to the large portion of the solar spectrum which falls outside the energy range suitable for photovoltaic absorption. For example, in silicon-based photovoltaic cells ~35% of the solar photon intensity is below the Si band gap energy, Eg, and cannot be absorbed. Another ~32% has energy greater than 2 Eg which results in large energy losses due to charge carrier thermalization. Converting these sections of the solar spectrum to easily absorbed photons through DC and UC, such as through rare-earth enable DC and UC, can enable photovoltaic efficiencies above the Shockley-Queisser theoretical efficiency limit ~30%.

In both DC and UC luminescent materials, the local structure and coordination of the rare earth dopants has critical implications for the emission properties—insufficient distance between adjacent emitters can lead to non-radiative losses/quenching, and in the case of multiple co-dopants, the distance between absorbing and emitting ions can strongly influence the energy transfer between them. However, conventional methods of depositing DC/UC materials (ion implantation, sintering, etc.) lack local control, and instead rely on the overall statistical concentration and distribution of dopants into the matrix or host material. In contrast, the use of ALD by the present inventions offers a unique opportunity to not only control at the atomic level the dopant concentration, but also the distance between dopants and their chemical environment.

The present invention enables the production of UC/DC materials with more efficient use of rare earth metals—achieving superior performance with the same amount of rare earths, or maintaining equivalent performance while reducing consumption of materials which may be declared critical due to their technological importance or risk of supply disruption. Increased Quantum efficiencies in DC phosphors are possible for vacuum ultraviolet (VUV) to visible light conversion in plasma displays and mercury-free fluorescent lamps, which could produce considerable economic and environmental impact. With current government mandates on the use of CFLs in homes, the mercury content in fluorescent light bulbs has come under recent scrutiny. The present invention would lead to an elimination of the need for mercury in those products, while maintaining the high efficiency associated with fluorescent lights. The current efficiencies of Plasma display panels (PDP) are approximately half that of cathode ray tubes and significant improvement can be made in the efficiency of the DC phosphors used.

The use of Atomic layer deposition for UC and DC conversion require the addition of a second dopant in the matrix of choice (preferably a material that have low phonon density of states in the optical range). The second dopant is used as the absorber that transfer the excitation to the first dopant: For instance DC can be achieve with Er:Yb doped Yttria. where Yb (Ytterbium) is used as the absorber, The absorber (Yb) is generally present in higher concentration than the first dopant (Er).

Materials for Use in Spintronics

Materials produced by the present invention may be used as materials for spintronics. Spintronics relies on the using spin excitations or magnons to carry information and energy without losses, a definitive advantage over the common charge-based transport. Spintronics materials are often doped semiconductors that rely also on the well-controlled dopant local concentration and large scale homogeneity. It has been shown that inhomogeneous dopant concentration acts as defects and leads to a shorter excitation lifetime and therefore limits the range of application. The present invention provides for the production locally-controlled doped materials via ALD, thus providing for spintronics materials with a wider range of applications.

Materials for Use in Thermoelectrics

Materials produced by the present invention may be used as materials for thermoelectrics. The dimensionless figure of merit, $ZT=S^2\sigma T/\kappa$, is the preferred measure for the performance or efficiency of thermoelectric materials, where S is the thermo-power and $\sigma$ and $\kappa$ the electric and thermal conductivities, respectively. Recently, ZT values of 2.4 in layered nanoscale structures at 300K, and 3.2 for a bulk semiconductor with nanoscale inclusions at about 600K were reported. However, these high values of ZT (which would be in the range for applications) are reached under quite restrictive conditions and are not suitable for applications. The transport properties are very sensitive to the local dopant concentration and chemical environment, as a consequence inhomogeneous dopant distribution often leads to a deterioration of the figure of merit. Through the present invention, locally controlled dopant concentrations can be obtained which can yield materials with a higher figure of merit, ZT. The ability to control the doping, and therefore both $\sigma$ and $\kappa$ of the material, through the present invention goes beyond that previously possible and allows for focusing on multiphasic materials which further improves the figure of merit, ZT, and thus broader applications.

Figure 5:
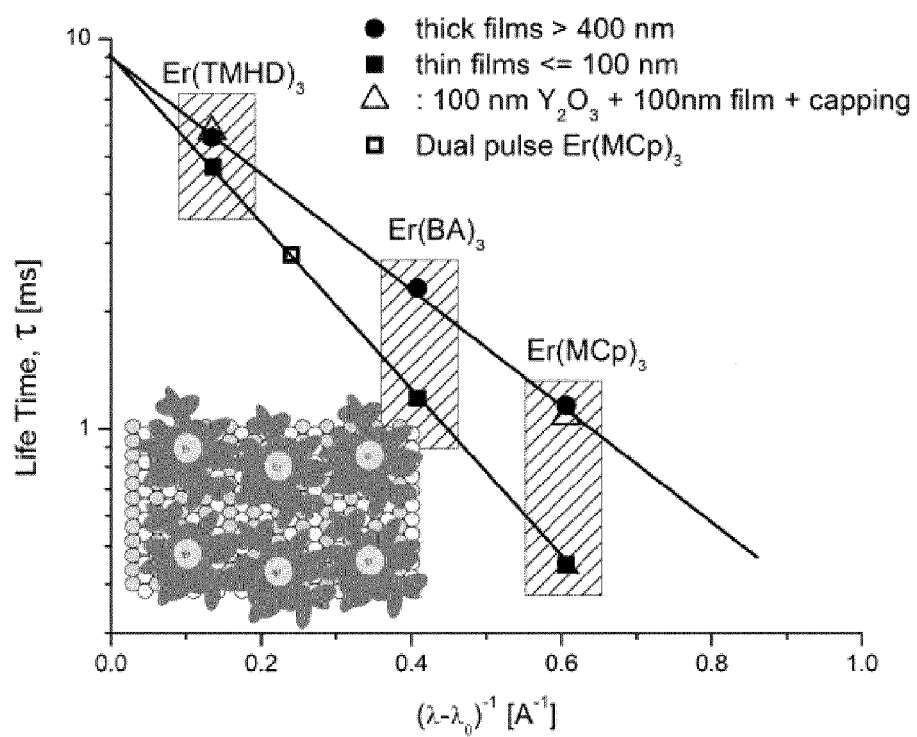
FIG. 5 illustrates the dependence if the lifetime measured at 1.5 µm as a function of the ligand size of the Erbium precursors used.
Figure 6:
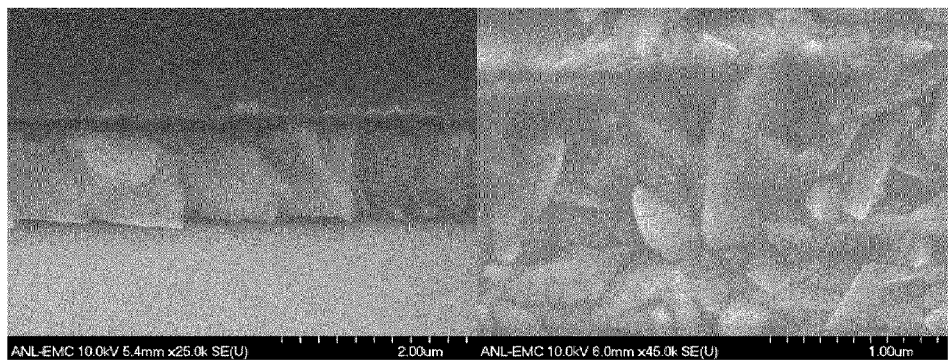
FIG. 6 illustrates the crystallinity of the as grown Yttria film by Atomic layer deposition.
Figure 7:
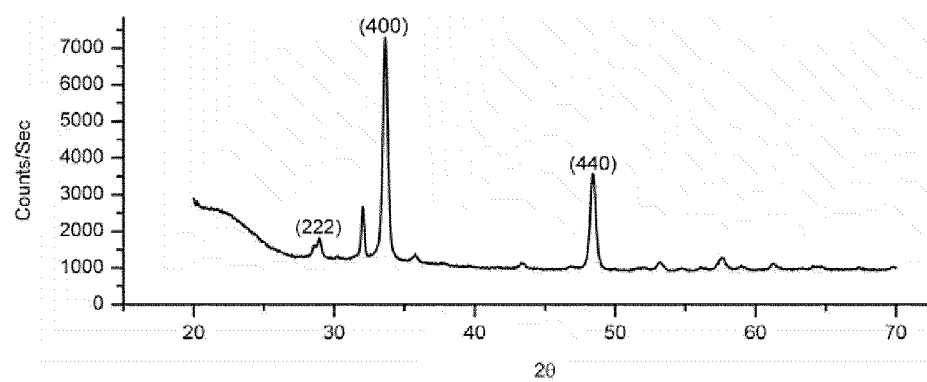
FIG. 7 illustrates the crystalline emission lines of Erbium at 1.5 µm in a Er doped Yttria films made by atomic layer deposition and compared with a Er doped Yttria powder used as a reference standard.
Figure 8:
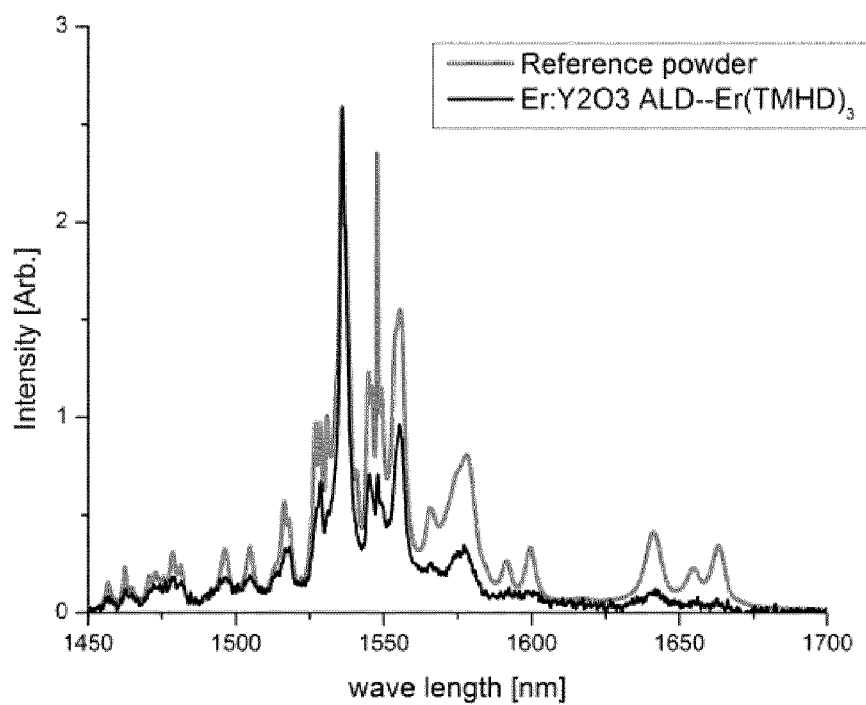
FIG. 8 illustrates the single exponential decay of the lifetime of post-annealed Yttria films doped with various Er precursor molecules.
Figure 9:
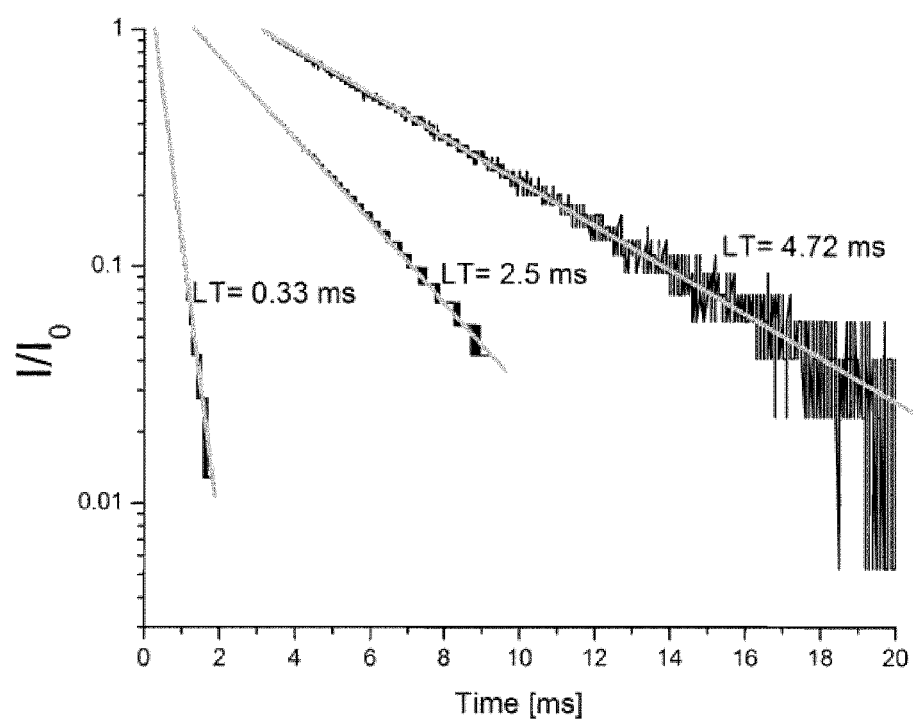
FIG. 9 illustrates the dependence if the lifetime measured at 1.5 µm as a function of the Er doping concentration. In red is a previous study of the lifetime of Er doped fiber grown by ALD.
Figure 10:
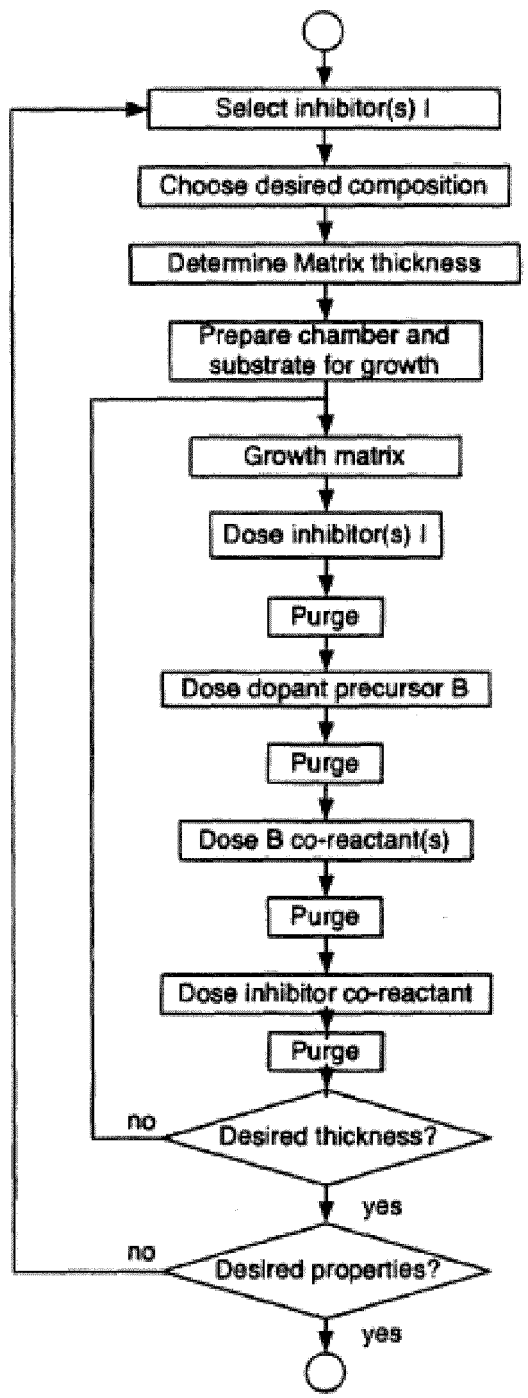
FIG. 10 illustrates an ALD specific method of producing materials.

FIG. 5 illustrates an example method of carrying out the invention through ALD.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described to explain the principles of the present invention and its practical application to enable one skilled in the art to utilize the present invention in various embodiments and with various modifications as are suited to the particular user contemplated. The features of the embodiments described herein may be combined in all possible combinations of methods, apparatus, modules and systems.

What is claimed is:

1. A method for producing a final phase of a crystalline material for use in a fiber laser of desired composition and thickness through atomic layer deposition, comprising the steps of:
   introducing a first precursor consisting of a Yttrium precursor into a growth chamber;
   purging the growth chamber;
   introducing a second precursor consisting of an Erbium precursor into the growth chamber which acts as a dopant and forms a doping level of at least 0.5%;
   purging the growth chamber;
   introducing an oxygen co-reactant into the growth chamber forming a phase of the crystalline material; and
   annealing the phase of the crystalline material at or above 600 up to 750° C. to form the final phase of the crystalline material, thereby achieving a crystalline material having a fiber laser emission lifetime greater than 6 ms.

2. The method of claim 1 wherein the crystalline material has a crystalline emission line, single exponential decay lines, and lifetimes greater than 6 ms despite a high doping level that is above 0.5%.

3. The method of claim 1 wherein the Yttrium precursor is selected from the group consisting of: $Y(Cp)_3$ or $Y(MeCp)_3$.

4. The method of claim 1 wherein the Erbium precursor is selected from the group consisting of: $Er(MeCp)_3$, $Er(BA)_3$, or $Er(TMHD)_3$.

5. The method of claim 1 wherein the oxygen source is selected from the group consisting of: $H_2O$, $H_2O_2$, $O_3$, oxygen plasma, or mixtures of these oxygen sources.

6. The method of claim 1 wherein the crystalline material is Erbium-Doped Yttrium Oxide ($Er^{+3}:Y_2O_3$).

7. The method of claim 1 wherein the crystalline material is a film.

8. The method of claim 1 wherein the crystalline material is suitable for up conversion.

9. The method of claim 1 wherein the crystalline material is suitable for use in down conversion.

10. The method of claim 1 wherein the crystalline material is suitable for use in spintronics.

11. The method of claim 1 wherein the crystalline material is suitable for use in thermoelectrics.

12. The method of claim 1 comprising the additional step of using a B-reaction to burn off ligands to allow patterned as opposed to random deposition.

* * * * *